United States Patent
Dijken et al.

(10) Patent No.: US 6,576,864 B2
(45) Date of Patent: Jun. 10, 2003

(54) METHOD OF LASER WELDING

(75) Inventors: Durandus Kornelius Dijken, Eindhoven (NL); Willem Hoving, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 37 days.

(21) Appl. No.: 10/024,758

(22) Filed: Dec. 19, 2001

(65) Prior Publication Data

US 2002/0079296 A1 Jun. 27, 2002

(30) Foreign Application Priority Data

Dec. 22, 2000 (EP) .............................. 00204789

(51) Int. Cl.[7] .............................................. B23K 26/20
(52) U.S. Cl. ................................................ 219/121.64
(58) Field of Search ................... 219/121.63, 121.64, 219/121.82, 121.83, 121.85

(56) References Cited

U.S. PATENT DOCUMENTS 5,828,033 A * 10/1998 Mitsuyoshi et al.
5,897,796 A * 4/1999 Forrest

FOREIGN PATENT DOCUMENTS

| EP | 0687519 | 12/1998 | ........... B23K/26/00 |
| EP | 1132168 A2 | 9/2001 | ........... B23K/26/06 |
| FR | 2731373 A1 | 9/1996 | ........... B21D/22/04 |
| GB | 2175737 A | 12/1986 | ............. H01S/3/23 |
| GB | 2218660 A | 11/1989 | ........... B23K/26/00 |
| WO | WO9211971 | 7/1992 | ........... B23K/26/00 |

OTHER PUBLICATIONS

Patent Abstracts of Japan, Ishikawa Ken, "Laser Welding Method," Publication No. 53094240, Aug. 18, 1978, Application No. 52008374, Jan. 28, 1977.
Patent Abstracts of Japan, Kuno Hirohiko, "Laser Welding Method of Galvanized Steel Sheet, " Publication No. 04251684, Sep. 8, 1992, Application No. 03023942, Jan. 24, 1991.
Patent Abstracts of Japan, Hase Hiroshi, "Laser Beam Welding Method, " Publication No. 07080669, Mar. 28, 1995, Application No. 05226145, Sep. 10, 1993.
Patent Abstracts of Japan, Ishikawa Ken, "Laser Welding Method," Publication No. 56062688, May 28, 1981, Application No. 54136351, Oct. 24, 1979.

* cited by examiner

Primary Examiner—Samuel M. Heinrich

(57) ABSTRACT

Method of laser welding which comprises at least two steps: a first step wherein the laser (10) is operated for some time T1 at low intensity in order to create a melt (31) in one part (12) with little or no evaporation of matter, thereby reducing product contamination, and a further step wherein the laser is operated for a shorter time T2 at high intensity in order to push said melt (31) towards a further part (13), whereby large gaps between said parts can be bridged, yet further reducing product contamination thanks to the low laser energy needed to proceed with the further step. Optionally, a third step is performed during a third period of time (T3) in which the weld is post-heated.

10 Claims, 3 Drawing Sheets

METHOD OF LASER WELDING

BACKGROUND OF THE INVENTION

The invention relates to a method of welding parts together by means of laser beams.

Such methods are known, but—although performing well in many applications—present a number of shortcomings. One problem is that when using such methods, parts are contaminated due to evaporated matter which re-deposits on the parts during the welding process. Another problem is that such methods require precise tolerances for the gap between the parts during the welding process.

In the method known from EP687519, parts to be welded are pressed together in the vicinity of the laser beam in order to ensure that the maximum gap between parts is not exceeded. This method considerably constrains handling of the parts prior to and during the welding process, as well as the parts themselves. Moreover, it does not solve the problem of contamination.

Product contamination and/or bad welds due to incorrect distance between parts may lead to the product being rejected, thereby reducing the efficiency of the process.

SUMMARY OF THE INVENTION

It is an object of the invention to provide a method of laser welding having an improved efficiency.

To this end, the method is characterized in that it proceeds in at least two steps comprising:
  a first step wherein at least one melt is created in at least one part at a first laser intensity, and
  a further step wherein said at least one melt is pushed towards a further part at a second laser intensity, higher than said first laser intensity, whereby said at least one part and said further part are welded together.

Such a method is more efficient because a smaller number of products will be rejected due to contamination and/or bad welds.

Contamination is mainly due to matter which is vaporized during the welding process and re-deposits on the product. There is almost no contamination in the first step of the method because it proceeds essentially with melting the matter without or with very little evaporation. In the further step of the method, a higher laser intensity is used in order to evaporate some matter, thereby creating a vapor recoil pressure which will push the melt created during the first step towards the further part. Due to the molten state of said melt, the amount of energy required to push said melt is reduced and therefore the amount of evaporated matter is reduced too. Contamination is consequently reduced in the further step.

Bad welds occur when the gap between parts is too large to be bridged by the melt. In the further step of the method, the melt of one part is pushed towards a further part, thereby allowing to bridge large gaps between these parts. The method thus increases the tolerated gap between parts to be welded and consequently reduces the risk of bad welds.

The method is preferably applied to spot welding of parts. Within the concept of the invention, the gap between parts to be welded ($g_p$) corresponds to the distance between facing sides of said parts, taken along the axis of the laser beam. The maximum which can be bridged by the weld depends on the thickness ($e_p$) of the part in which the melt is first created, said thickness being the distance taken along the laser beam axis between opposite sides of said part.

When applying the method according to the invention, clean and proper spot welds are achieved, even when $g_p \geq 0.4e_p$, a result which is difficult to achieve—if at all achievable—with prior art laser welding methods.

In particular embodiments, clean and proper spot welds are achieved even when $g_p \geq 1.0e_p$, which represents a gain in tolerated gap by a factor of two and a half compared to prior-art laser welding methods, yet reducing contamination e.g. by a factor of two.

After said further step of the method, it may be advantageous to proceed with a subsequent step comprising a post-heating of the weld at another laser intensity in order to increase the melt volume, again without or with very little evaporation of matter.

Furthermore, various positions of the laser beam with regard to the parts to be welded are possible. In preferred embodiments, the laser beam comes from above the part in which the melt is created, In other embodiments, the laser beam may also come from below or from beside the part in which the melt is created.

The laser beam preferably strikes the part in which the melt is to be made substantially at right angles, but, in embodiments in which the parts to be welded are difficult to reach, the laser beam may strike under an angle.

In particular embodiments, more than one laser beam may be used. In a preferred case, two laser beams are used, a first one coming from above a first part, a second one coming from below a further part, thereby allowing to bridge even larger gaps up to the sum of the thicknesses of the parts between parts than with a single laser beam.

The method is preferably applied to laser welding of metallic parts.

The second part may be formed by or comprise a metallic layer on a substrate. The substrate may be a ceramic substrate or a flexible substrate (such as a plastic film) or, for instance, a printed circuit board.

The method is of particular use in embodiments in which the second part is vulnerable to heat input or to contamination. This may be the case if a metal part has to be connected to or near an electronic device (for instance, a printed circuit board). In embodiments where one laser beam hitting the first part is used, said laser beam does not penetrate through the first part, or at least the chance of this happening is very small, so that direct laser heat input in the second part is small. Furthermore, contamination is reduced.

The method in accordance with the invention also enables materials to be welded which can otherwise not be welded, or only with great difficulty. One such example is a weld of stainless steel (as a first part) on aluminium (as a second part or the top layer of the second part). It has been found that such a weld can be made easily and without great contamination by means of the method in accordance with the invention, whereas in conventional laser welding methods, this is difficult, if not almost impossible, at least not without using excessive laser powers and the resulting extensive contamination.

BRIEF DESCRIPTION OF THE DRAWINGS

These and further aspects of the invention will be explained in greater detail by way of example and with reference to the accompanying drawings, in which.

The Figures are not drawn to scale. In general, like reference numerals refer to like parts.

DETAILED DESCRIPTION OF PREFERRED EMBODIMENTS

Figure 1:
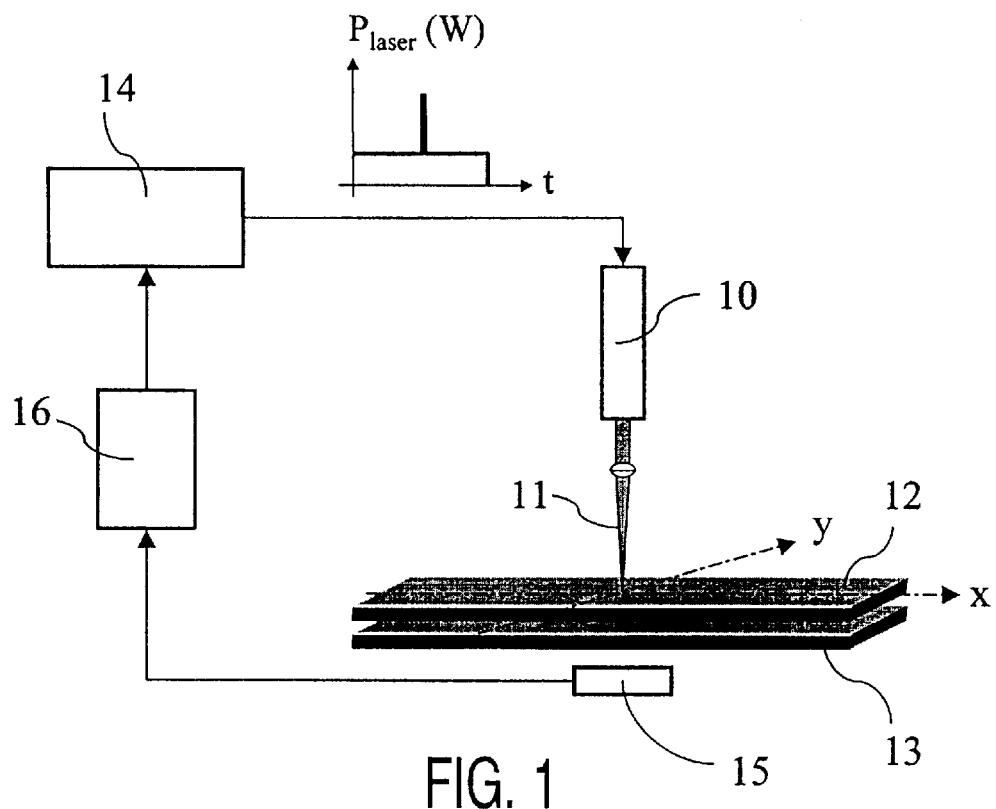
FIG. 1 is a graph showing the power of the laser beam as a function of time according to a preferred embodiment of the invention.

A laser welding method according to a preferred embodiment of the present invention will be described hereinafter. Said method is preferably applied to spot welding of metal plates. An example of a setup allowing to perform such welding is schematically shown in FIG. 1. The setup comprises a laser device 10 emitting a laser beam 11 directed to and focused on the top plate 12 of the plates 12, 13 to be welded, a laser control device 14 controlling the power Plaser of the laser device 10, a sensing device coupled to a measurement device 15 to measure the position of the plates to be welded in the X and Y directions, and a feedback 16 from this measurement device to the laser control device 14 in order to appropriately control the power of the laser device. The little figure above the line connecting laser control device 14 to laser 10 indicates schematically the laser power Plaser as a function of time t. This will be further illustrated in FIGS. 2 and 3a to 3c.

Figure 2:
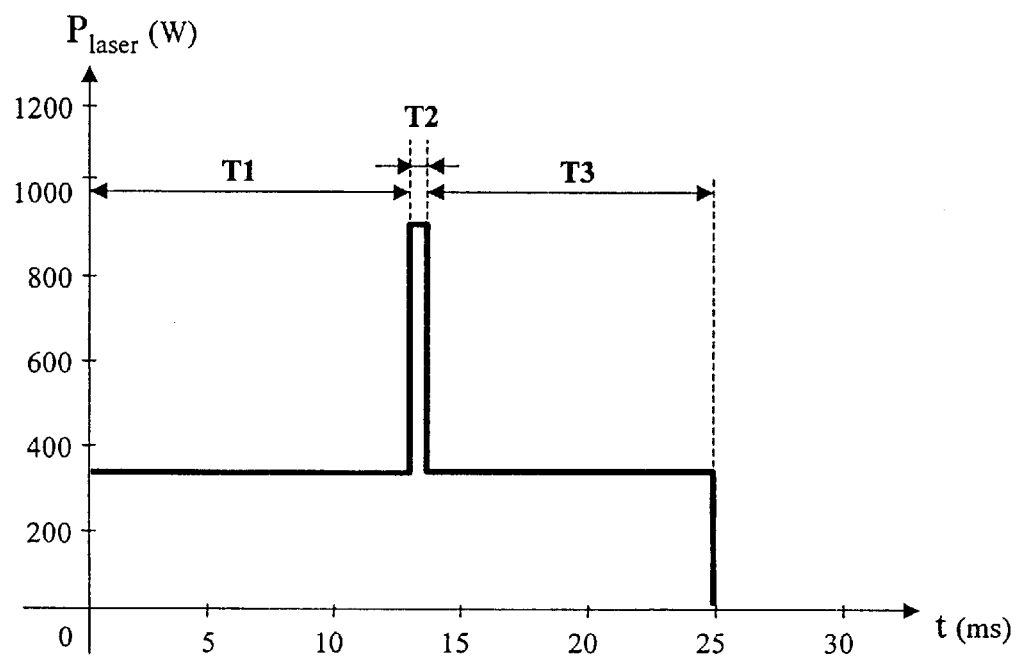
FIG. 2 is a schematic representation of a means for performing laser spot welding of plates according to a preferred embodiment of the invention.

FIG. 2 shows the laser intensity Plaser as a function of time t for the welding of one spot.

The first period of time (T1) corresponds to the first step of the method in which a melt is made in the first part 12. During this period of time, the laser operates at a first laser intensity sufficient to create the melt.

The second period of time (T2) corresponds to a further step of the method. The laser is operated at a second higher intensity. Matter is evaporated, thereby creating a vapor recoil pressure which will push the melt created during the first step towards the further part. Due to the molten state of said melt, the amount of energy required to push said melt is reduced and therefore the amount of evaporated matter is reduced.

In some cases, it is advantageous to proceed with a subsequent step, corresponding to a third period of time (T3). During this period of time the melt is increased. Such a step increases the extent and thereby the strength of the weld.

The periods of time roughly indicated in FIG. 2 are given on an exemplary, non-limitative basis, though they correspond to practical values within an order of magnitude depending on the characteristics of the materials to be welded and on the laser.

FIG. 2 illustrates an embodiment of the invention in which a single high intensity laser shot is performed in period of time T2. In some embodiments, a double (or more generally, a multiple) laser shot may be performed. A first high-intensity laser shot agitates the melt and brings it to oscillation, the second high-intensity laser shot is then timed to coincide with a movement of the melt towards the second part. In this manner, less energy is needed for the weld and there is less contamination.

Figure 3:
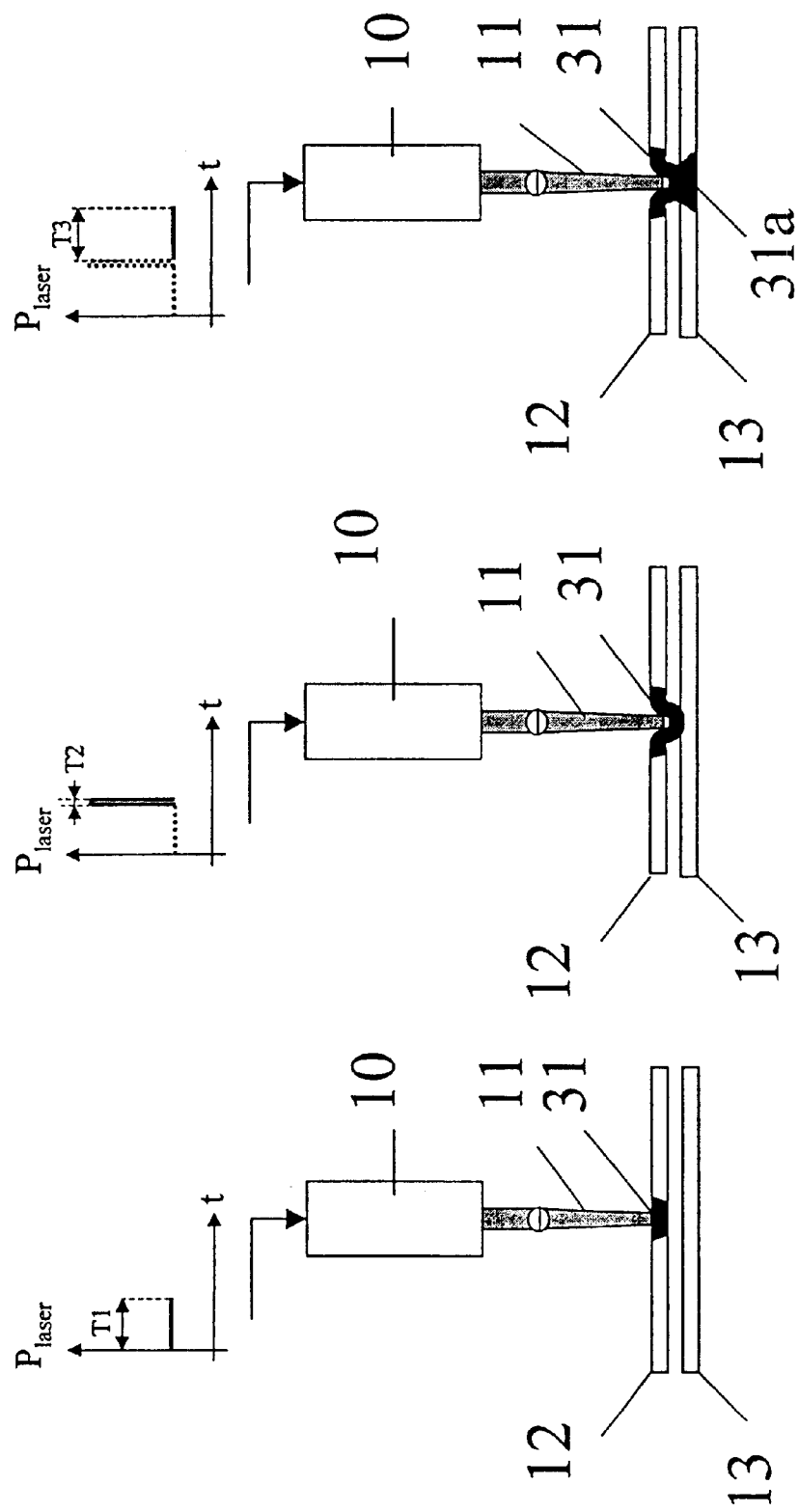
FIGS. 3a and 3b are schematic representations of the first and the further step, respectively, of the method according to the invention.
FIG. 3c is a schematic representation of an optional subsequent step of the method according to the invention.

FIG. 3a illustrates the first step of the method. A melt 31 is produced in part 12.

FIG. 3b illustrates the further step of the method. The melt 31 is pushed towards part 12.

FIG. 3c illustrates the optional subsequent step of the method. The extent of the melt is increased (part 31a of melt 31). In this example, the third laser beam intensity is substantially equal to the first laser beam intensity, which, from a point of control, is a preferred easy embodiment. However, in some embodiments, the third laser beam intensity may differ from the first laser beam intensity.

Figure 4:
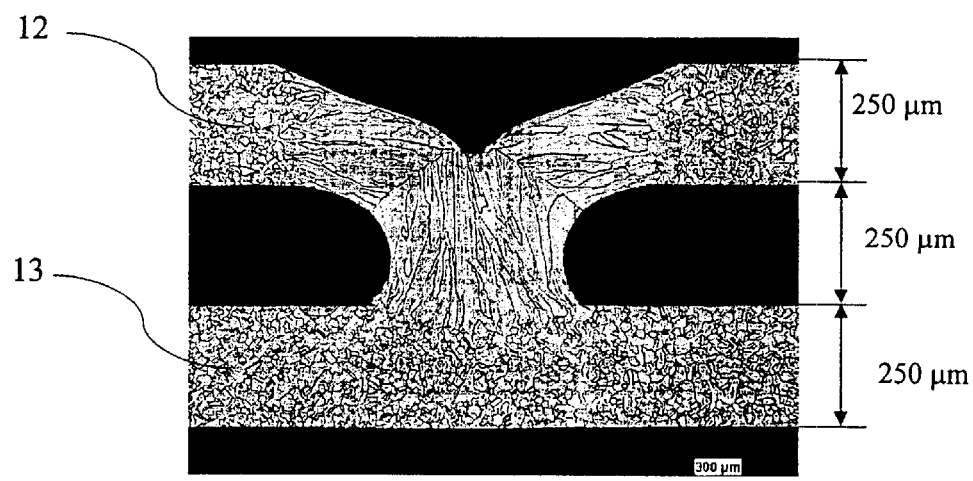
FIG. 4 is a picture of a cross-section of a spot weld performed according to the invention between two stainless steel plates, each 250 μm thick, with a gap of 250 μm between said plates.

A spot weld made in accordance with an embodiment of the method of the present invention can be seen in FIG. 4. It pictures a cross-section of a spot weld performed between two stainless steel plates 12 and 13, each 250 μm thick, and placed on top of each other with a gap of 250 μm.

The gap is bridged, and a solid weld 31 is made.

In this example, the laser beam was incident on part 12. Even larger gaps may be bridged if two laser beams are used, one incident on part 12 and one incident on part 13.

Figure 5:
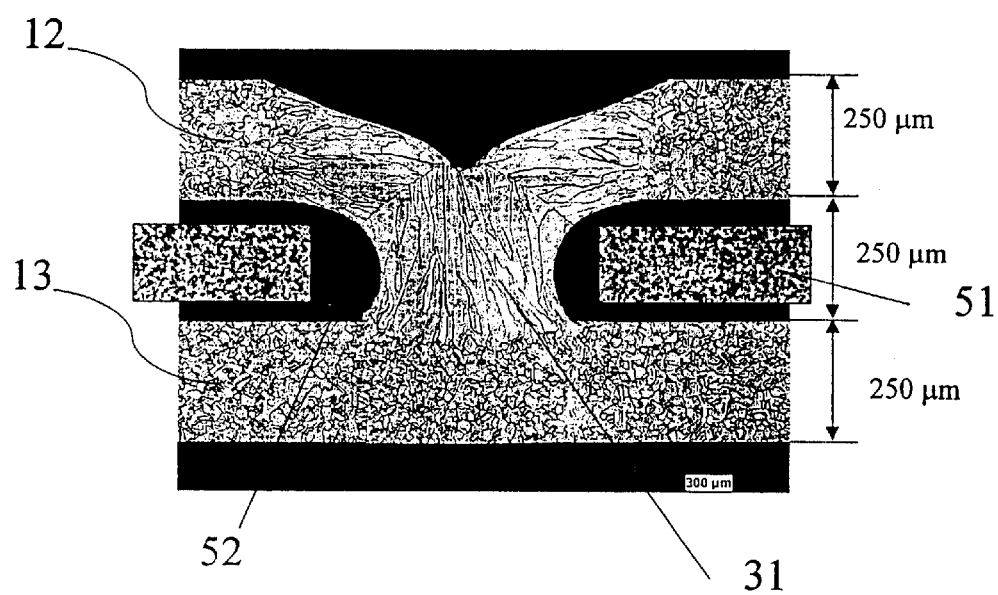
FIG. 5 shows in a cross-section a construction made by using the method in accordance with the invention.

FIG. 5 shows schematically a construction that can be made by the method in accordance with the invention. In between two plates 12 and 13, in between which a weld 31 is made, an intermediate plate 51 is positioned, having an aperture 52, through which the weld 31 extends. The aperture 52 is larger than the weld 31, so that plate 51 has a (be it limited) freedom of movement in the gap formed between parts 12 and 13. In this manner, flexible constructions can be made. Such constructions can be used for moving parts.

The method can be used in a variety of ways.

In the examples, a single laser beam is used. Although this is a preferred embodiment as regards simplicity of the setup, in embodiments of the invention two laser beams can be used, one for forming the melt, the other for pushing the melt towards the second part. Without putting restrictions on the applicability of such two laser embodiments of the method according to the invention, a number of possible advantageous uses is herein described.

Laser welds along a line could be made whereby the first laser (operating continuously) may be focused slightly 'ahead of' the second laser which operates in a pulsed manner.

The wavelength of the light emitted by the first laser may be tuned to heating the material, whereas the wavelength of the laser light emitted by the second laser may be tuned to evaporating the material.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim.

What is claimed is:

1. A method of welding parts together by means of at least one laser beam (11), characterized in that the method proceeds in at least two steps comprising:

a first step wherein at least one melt (31) is created in at least one part (12) at a first laser intensity, and a further step wherein said at least one melt (31) is pushed towards a further part (13) at a second laser intensity, higher than said first laser intensity, whereby said at least one part and said further part are welded together.

2. A method as claimed in claim 1, characterized in that the at least one part has a thickness and in that a gap exists between the parts, the thickness ($e_p$) being the distance between one side and the corresponding opposite side of said at least one part, and the gap ($g_p$) being the distance between facing sides of the at least one part and the further part.

3. A method as claimed in claim 2, characterized in that it is a method of spot welding.

4. A method as claimed in claim 2, characterized in that the gap is larger than or equal to forty percent of the thickness ($g_p \geq 0,4e_p$).

5. A method as claimed in claim 4, characterized in that the gap is larger than or equal to one hundred percent of the thickness ($g_p \geq 1,0e_p$).

6. A method as claimed in claim 1, characterized in that it comprises a subsequent step (T3) wherein the at least one laser beam is operated at a third laser intensity, lower than the second laser intensity.

7. A method as claimed in claim 1, characterized in that the at least one laser beam comes from above the at least one part.

8. A method as claimed in claim 1, characterized in that the at least one laser beam comes from below the at least one part.

9. A method as claimed in claim 1, characterized in that, during the first step, a further laser beam is used for creating a second melt in the further part, whereby in the second step the at least one melt and the second melt are pushed towards each other.

10. A method as claimed in claim 1, characterized in that the parts are metallic parts.

* * * * *